United States Patent
Kim et al.

(10) Patent No.: US 9,853,240 B2
(45) Date of Patent: Dec. 26, 2017

(54) ORGANIC LIGHT EMITTING DISPLAY DEVICE AND METHOD FOR MANUFACTURING THE SAME

(71) Applicant: Samsung Display Co., Ltd., Yongin, Gyeonggi-Do (KR)

(72) Inventors: Seung Hun Kim, Hwaseong-si (KR); Tae Wook Kang, Seongnam-si (KR); Seung Yong Song, Suwon-si (KR); Sang Hwan Cho, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/748,988

(22) Filed: Jun. 24, 2015

(65) Prior Publication Data

US 2016/0118624 A1    Apr. 28, 2016

(30) Foreign Application Priority Data

Oct. 28, 2014   (KR) .................. 10-2014-0147446

(51) Int. Cl.
*H01L 51/52*   (2006.01)
*H01L 27/32*   (2006.01)
*H01L 51/56*   (2006.01)

(52) U.S. Cl.
CPC ...... *H01L 51/5246* (2013.01); *H01L 27/3244* (2013.01)

(58) Field of Classification Search
CPC .. H01L 51/5259; H01L 51/56; H01L 27/3244
See application file for complete search history.

(56) References Cited

U.S. PATENT DOCUMENTS

| | | | |
|---|---|---|---|
| 6,717,052 B2* | 4/2004 | Wang | H05B 33/04 174/381 |
| 2006/0066234 A1 | 3/2006 | Lu et al. | |
| 2009/0026945 A1* | 1/2009 | Boroson | H01L 51/524 313/512 |
| 2010/0013384 A1* | 1/2010 | Song | H01L 51/5246 313/504 |
| 2010/0155247 A1 | 6/2010 | Cao et al. | |
| 2012/0032355 A1 | 2/2012 | Wang et al. | |

(Continued)

FOREIGN PATENT DOCUMENTS

| | | |
|---|---|---|
| JP | 2013-218234 | 10/2013 |
| KR | 10-2009-0121500 A | 11/2009 |

(Continued)

*Primary Examiner* — Joseph L Williams
(74) *Attorney, Agent, or Firm* — Knobbe Martens Olson & Bear LLP

(57) ABSTRACT

An organic light emitting display device according to an exemplary embodiment of the present disclosure includes: a first substrate provided with a thin film transistor layer where a plurality of pixels are formed; a second substrate covering the first substrate; and a sealant formed along edges of the first and second substrates to bond both of the first and second substrates, wherein the sealant is formed above the thin film transistor of the first substrate, the sealant comprises an organic sealant and a protection member formed outside of the organic sealant, and the protection member is formed of a dual layer of an inorganic layer and an elastic member.

19 Claims, 13 Drawing Sheets

(56) References Cited

U.S. PATENT DOCUMENTS

| | | | |
|---|---|---|---|
| 2015/0009646 A1* | 1/2015 | Han | G02F 1/1339 361/784 |
| 2015/0034916 A1* | 2/2015 | Lee | H01L 51/5253 257/40 |
| 2015/0041794 A1* | 2/2015 | Gong | H01L 51/5246 257/40 |
| 2016/0013441 A1* | 1/2016 | Hong | H01L 51/5246 257/40 |

FOREIGN PATENT DOCUMENTS

| | | |
|---|---|---|
| KR | 10-2011-0020613 A | 3/2011 |
| KR | 10-2012-0134650 A | 12/2012 |

* cited by examiner

ORGANIC LIGHT EMITTING DISPLAY DEVICE AND METHOD FOR MANUFACTURING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims priority to and the benefit of Korean Patent Application No. 10-2014-0147446 filed in the Korean Intellectual Property Office on Oct. 28, 2014, the entire contents of which are incorporated herein by reference.

BACKGROUND

Field

This disclosure relates to an organic light emitting device and a manufacturing method thereof.

Description of the Related Technology

Rapid development in electronics technology has been to make more practical flat displays such as a liquid crystal display, a plasma display, an electroluminescent (EL) display, a light emitting diode (LED) display, and the like. In particular, the EL display has advantages in high light emission efficiency, a wide light viewing angle, and rapid response speed.

Among the EL displays, an organic EL element (i.e., an organic light emitting element), which is an organic electronic element, is formed by providing a multi-layered organic thin film formed of an emission layer, a hole injection layer, and an electron injection layer between a pair of electrodes on a substrate. The organic light emitting element emits light from recombination of electrons and holes that are injected to an emission layer.

In addition, unlike a conventional thin film transistor liquid crystal display (TFT-LCD), an organic light emitting element does not require a separate light source, and accordingly, the volume and weight of the element can be reduced and it can be driven with a lower voltage compared to a plasma display device (PDP).

Meanwhile, an organic emission layer and an electrode in the organic light emitting element can be easily oxidized by oxygen or moisture, and therefore permeation of oxygen or moisture into the organic light emitting element needs to be prevented.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY

The present disclosure has been made in an effort to provide an organic light emitting display device that can minimize a dead space and to which a sealant having waterproofing capability and durability is applied, and a method for manufacturing the same.

An organic light emitting display device according to an exemplary embodiment of the present disclosure includes: a first substrate provided with a thin film transistor layer where a plurality of pixels are formed; a second substrate covering the first substrate; and a sealant formed along the edge of the pixel area, not overlapped the pixel, wherein the sealant is formed above the thin film transistor of the first substrate, the sealant comprises an organic sealant and a protection member formed outside of the organic sealant, and the protection member is formed of a two-element structure dual layer which includes an inorganic layer and an elastic member.

The protection member may include a material being cured by ultraviolet rays.

The organic sealant may include an epoxy-based material.

The inorganic layer may be made of $AlO_2$ or $TiO_2$.

The elastic member may be a polymer material.

The elastic member may be an epoxy-based resin.

The protection member may have a three-element structure by additionally including an inorganic layer formed outside of the elastic member.

The elastic member may fill a space between the first substrate and the second substrate along the edge of substrate assembly, not overlapped the pixel area.

The organic light emitting display device may include an inorganic layer formed outside of the elastic member.

A touch sensor may be formed in the second substrate.

An organic light emitting display device according to an another exemplary embodiment of the present disclosure includes: a first substrate provided with a thin film transistor layer where a plurality of pixels are formed; a second substrate covering the first substrate; and a sealant formed along edges of the first and second substrates to bond both of the first and second substrates, wherein the sealant is formed above the thin film transistor of the first substrate, the sealant comprises an organic sealant and a protection member formed outside of the organic sealant, and the protection member is formed of a two-element structure of an inorganic layer and an elastic member.

Another exemplary embodiment of the present disclosure provides a method for manufacturing an organic light emitting display device. The method includes: preparing a first substrate where a plurality of organic light emitting elements are formed and a second substrate; providing an organic sealant along the edge of pixel area, not overlapped the pixel between the first substrate and second substrate; curing the organic sealant by irradiating ultraviolet rays to the organic sealant; forming an inorganic layer outside of the organic sealant; and forming an elastic member outside of the inorganic layer.

The organic sealant may include an epoxy-based material.

The organic sealant may not contact the first substrate.

The inorganic layer may be made of $AlO_2$ or $TiO_2$.

The inorganic layer may be deposited through atomic layer deposition.

The elastic member may be an epoxy-based resin.

The elastic member may fill a space between the first substrate and the second substrate along the edge of substrate assembly, not overlapped the pixel area.

The method may further include, after forming the elastic member outside of the inorganic layer, forming an inorganic layer in the outside of the elastic member.

The elastic member may wholly fill a space between the first substrate and the second substrate.

As described, in the organic light emitting display device according to the exemplary embodiment of the present invention, the sealant is formed with a three-element structure of the organic sealant, the inorganic layer formed outside of the organic sealant, and the elastic member formed outside of the inorganic layer so that the sealant can be formed above the thin film transistor layer, thereby minimizing the size of a bezel, and the dual structure of the organic layer and the inorganic layer can provide a sufficient waterproof characteristic and the elastic member formed outside of the inorganic layer can prevent generation of cracks in the inorganic layer.

BRIEF DESCRIPTION OF THE DRAWINGS

These and/or other aspects will become apparent and more readily understood from the following description of the embodiments, taken in conjunction with the accompanying drawings in which.

DETAILED DESCRIPTION

Figure 1:
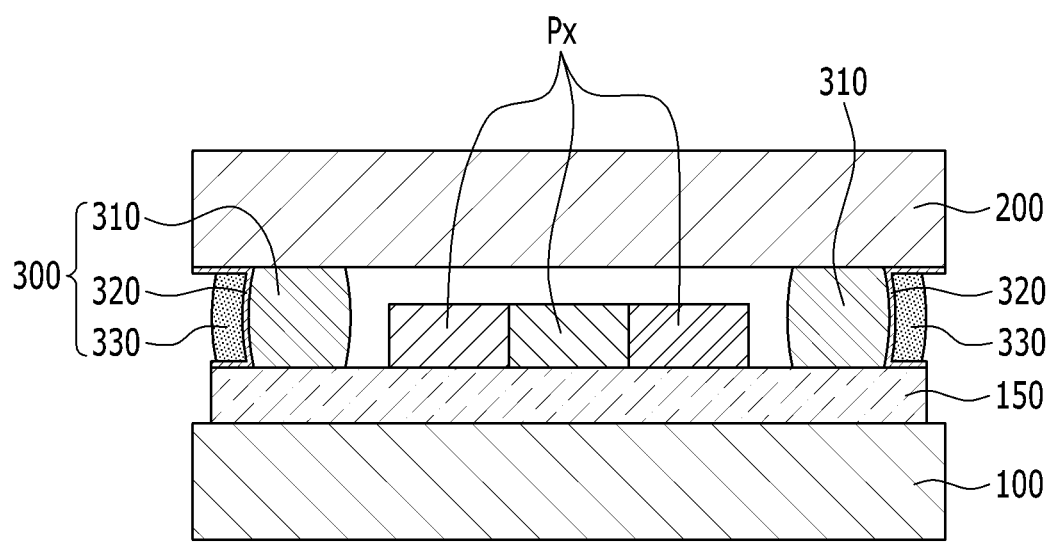
FIG. 1 is a cross-sectional view of an organic light emitting display device according to an exemplary embodiment.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. As used herein, the term "and/or" includes any and all combinations of one or more of the associated listed items.

Embodiments of the present disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the drawings, the thickness of layers, films, panels, regions, etc., are exaggerated for explanation. In other words, since sizes and thicknesses of components in the drawings are arbitrarily illustrated for convenience of explanation, the following embodiments are not limited thereto. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting display device according to an exemplary embodiment of the present disclosure will be described in detail.

FIG. 1 is a cross-sectional view of an organic light emitting display device according to an exemplary embodiment. Referring to FIG. 1, an organic light emitting display device according to the present exemplary embodiment includes a first substrate 100, a thin film transistor layer 150 formed on the first substrate 100, a second substrate 200, and a sealant sealing the first substrate 100 and the second substrate 200.

The first substrate 100 may be made of an inorganic material such as glass, an organic material such as a polycarbonate, poly(methyl methacrylate), polyethylene terephthalate, polyethylene naphthalate, a polyamide, polyethersulfone, or a combination thereof, a silicon wafer, and the like.

The second substrate 200 may be made of the same material as the first substrate 100, and the second substrate 200 may be a touch sensing panel where a touch sensor is formed.

The thin film transistor layer 150 is formed on the first substrate 100, and includes a plurality of pixels PX, each formed of a data line, a gate line, and a thin film transistor.

Next, referring to FIG. 3 to FIG. 5, each pixel of the organic light emitting display device according to the exemplary embodiment will be described in detail.

Figure 3:
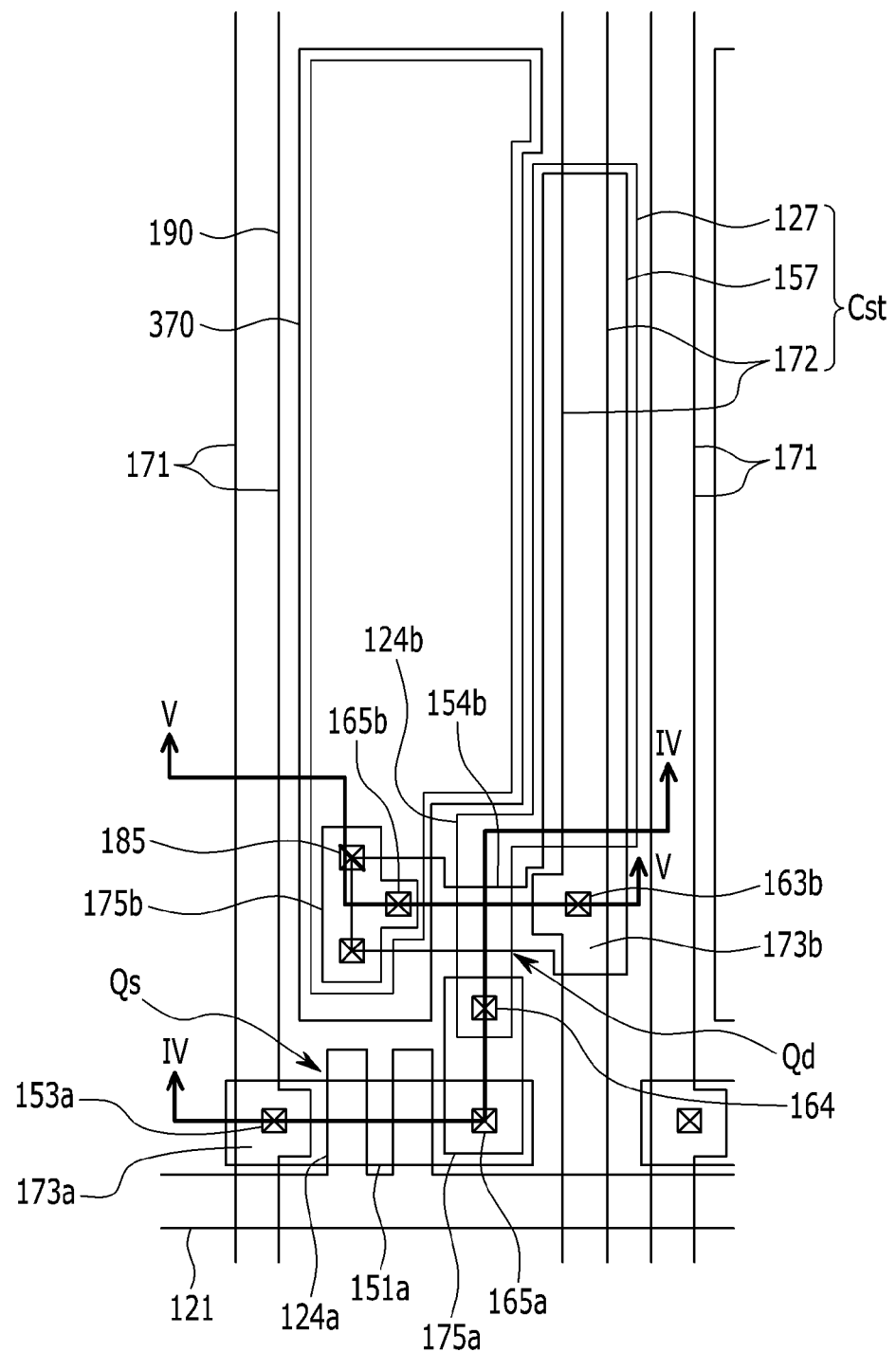
FIG. 3 is a layout view of an organic light emitting display device according to an exemplary embodiment.

FIG. 3 is a layout view of the organic light emitting display device according to the exemplary embodiment. FIG. 4 is a cross-sectional view of the organic light emitting display of FIG. 3, taken along the line IV-IV. FIG. 5 is a cross-sectional view of the organic light emitting display device of FIG. 3, taken along the line V-V.

A blocking layer 111 made of a silicon oxide or a silicon nitride is formed on the first substrate 100 made of transparent glass. The blocking layer 111 may have a dual-layer structure.

A plurality of pairs of first and second semiconductor islands 151a and 151b made of polysilicon are formed on the blocking layer 111. The semiconductor islands 151a and 151b include a plurality of extrinsic regions including an n-type or p-type conductive impurity, and at least one intrinsic region that hardly includes a conductive impurity.

In the first semiconductor island 151a, the extrinsic region includes a first source region 153a, a first drain region 155a, and an intermediate region 1535, and they are respectively doped with an n-type impurity and are separated from each other. The intrinsic region includes a pair of first channel regions 154a1 and 154a2 provided between the extrinsic regions 153a, 1535, and 155a (FIG. 4).

In the second semiconductor island 151b, the extrinsic region includes a second source region 153b and a second drain region 155b, and they are doped with a p-type impurity and are separated from each other. The intrinsic region includes a second channel region 154b provided between the second source region 153b and the second drain region 155b, and a storage region 157 extended upward from the second source and drain regions 153b and 155b (FIG. 5).

The extrinsic region may further include a lightly-doped region (not shown) provided between the channel regions 154a1, 154a2, and 154b and the source and drain regions 153a, 155a, 153b, and 155b. Such a lightly-doped region may be replaced with an offset region that hardly includes an impurity.

In contrast, the extrinsic regions 153a and 155a of the first semiconductor island 151a may be doped with the p-type impurity, or the extrinsic regions 153b and 155b of the second semiconductor island 151b may be doped with the n-type impurity. The p-type conductive impurity may include boron (B), gallium (Ga), and the like, and the n-type conductive impurity may include phosphor (P), arsenic (As), and the like.

A gate insulating layer 140 made of a silicon oxide or a silicon nitride is formed on the semiconductor islands 151a and 151b and the blocking layer 111.

Figure 4:
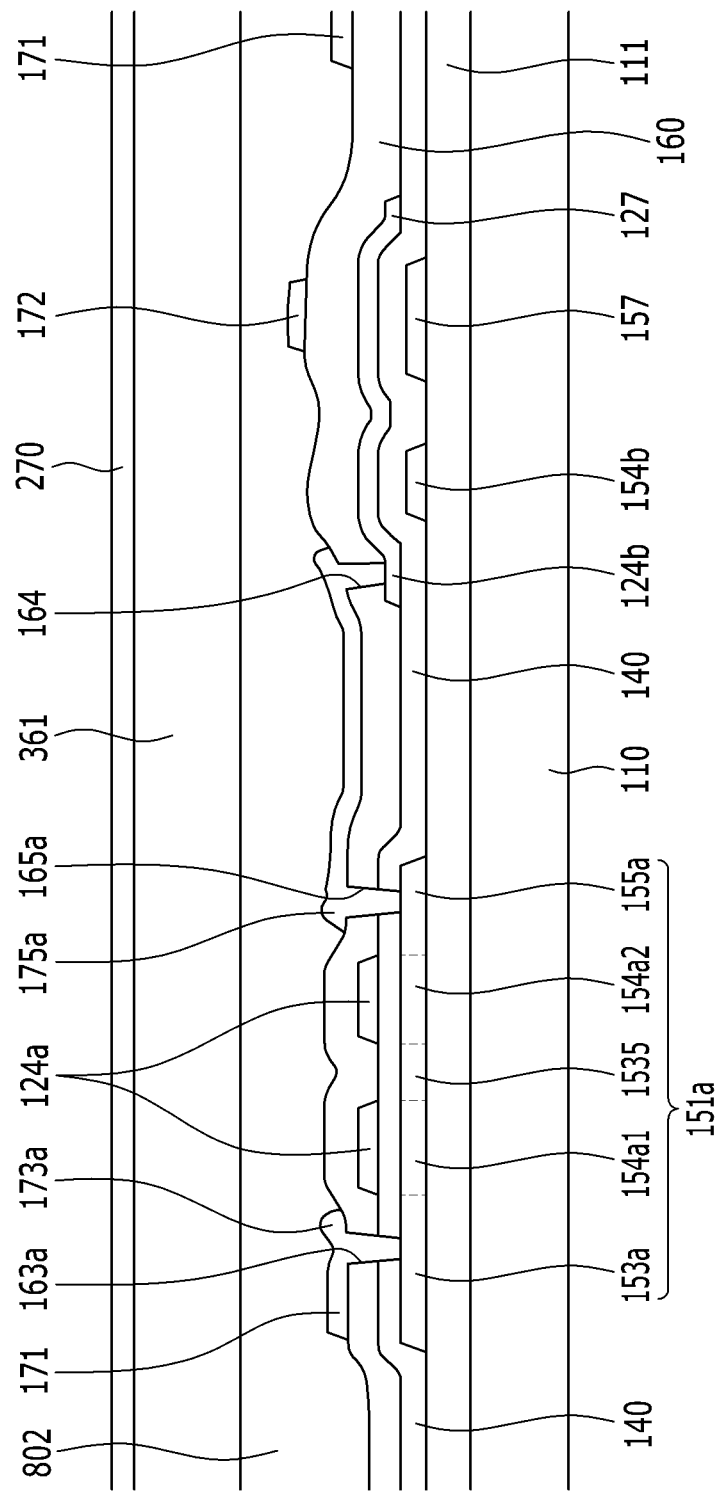
FIG. 4 is a cross-sectional view of the organic light emitting display device of FIG. 3, taken along the line IV-IV.

A plurality of gate lines 121 including a first control electrode 124a and a plurality of gate conductors including a plurality of second control electrodes 124b are formed on the gate insulating layer 140 (FIG. 4).

The gate lines 121 transmit a gate signal and substantially extend in a horizontal direction. The first control electrode 124a extends upward from the gate line 121 and crosses the first semiconductor island 151a. In this case, the first control electrode 124a overlaps the first channel regions 154a1 and 154a2 (FIG. 4). Each gate line 121 may include a wide end portion for connection with another layer or an external driving circuit. When a gate driving circuit generating the gate signal is integrated with the substrate 110, the gate line 121 is extended and thus may be directly connected with the gate driving circuit.

Figure 5:
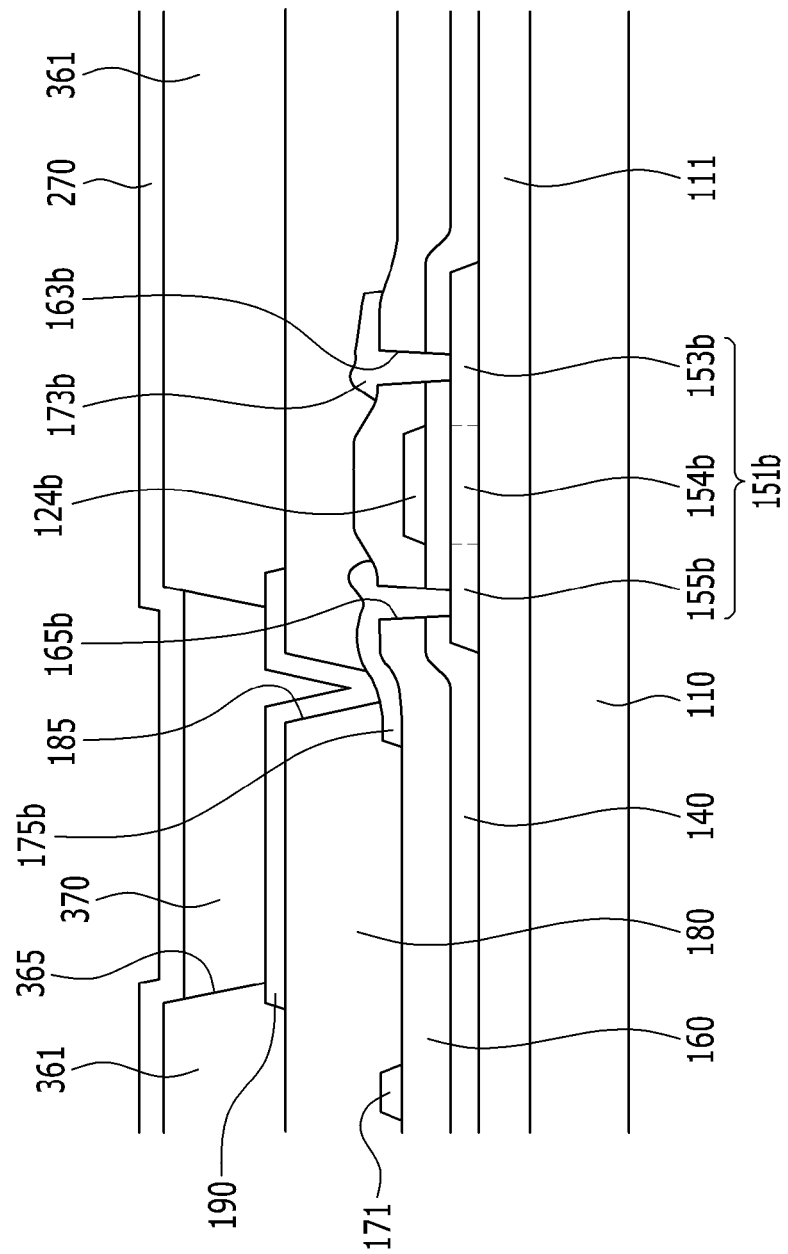
FIG. 5 is a cross-sectional view of the organic light emitting display device of FIG. 3, taken along the line V-V.

The second control electrode 124b is separated from the gate line 121 and overlaps the second channel region 154b of the second semiconductor island 151b (FIG. 5). The second control electrode 124b forms a storage electrode 127 by being extended, and the storage electrode 127 overlaps the storage region 157 of the second semiconductor island 151b.

The gate conductors 121 and 124b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). However, the gate conductors 121 and 124b may have a multilayered structure including at least two conductive layers having different physical properties. One of the conductive layers is made of a metal having low resistivity, for example, an aluminum-based metal, a silver-based metal, a copper-based metal, and the like so as to reduce a signal delay or a voltage drop. In contrast, the other conductive layer is made of another material, particularly a material having an excellent contact characteristic with indium tin oxide (ITO) and indium zinc oxide (IZO), for example, chromium (Cr), molybdenum (Mo), a molybdenum alloy, tantalum (Ta), titanium (Ti), or the like. A preferable example of combination of the two conductive layers may include a chromium lower layer and an aluminum (alloy) upper layer, and an aluminum (alloy) lower layer and a molybdenum (alloy) upper layer. However, the gate conductors 121 and 124b may be made of various metals and conductors other than the above-stated metals and conductors.

Side surfaces of the gate conductors 121 and 124b are inclined with an inclination angle of preferably about 30° to 80°.

An interlayer insulating film 160 is formed on the gate conductors 121 and 124b. The interlayer insulating layer 160 is made of an inorganic insulator such as a silicon nitride or a silicon oxide, an organic insulator, a low-dielectric insulator, and the like. A dielectric constant of the low-dielectric insulator is preferably 4.0 or less, and —Si:C:O, a-Si:O:F, and the like formed through plasma enhanced chemical vapor deposition (PECVD) are examples of such a low-dielectric insulator. The interlayer insulating layer 160 may be formed of an organic insulator having photosensitivity, and the interlayer insulating layer 160 may have a flat surface.

A plurality of contact holes 164 exposing the second control electrode 124b are formed in the interlayer insulating layer 160. In addition, a plurality of contact holes 163a, 163b, 165a, and 165b exposing the source and drain regions 153a, 153b, 155a, and 155b are formed in the interlayer insulating layer 160 (FIG. 4 and FIG. 5).

A plurality of data conductors including data lines 171, driving voltage lines 172, and first and second output electrodes 175a and 175b are formed on the interlayer insulating layer 160.

The data lines 171 transmit a data signal and substantially extend in a vertical direction to cross the gate lines 121. Each data line 171 includes a plurality of first input electrodes 173a connected with the first source region 153a through the contact hole 163a, and may include a wide end portion for connection with another layer or an external driving circuit. When a data driving circuit generating the data signal is integrated with the substrate 110, the data line 171 is extended and then connected with the data driving circuit.

The driving voltage lines 172 transmit a driving voltage and substantially extend in a vertical direction to cross the gate line 121. Each of the driving voltage lines 172 includes a plurality of second input electrodes 173b connected with the second source region 153b through the contact hole 163b. The driving voltage lines 172 overlap the storage electrodes 127, and may be connected with each other.

The first output electrode 175a is separated from the data line 171 and the driving voltage line 172. The first output electrode 175a is connected with the first source region 155a through the contact hole 165a, and is connected with the second control electrode 124b through the contact hole 164.

The second output electrode 175b is separated from the data line 171, the driving voltage line 172, and the first output electrode 175a, and is connected with the second source 155b through the contact hole 165b.

The data conductors 171, 172, 175a, and 175b are preferably made of a refractory material such as molybdenum, chromium, tantalum, titanium, and the like, or an alloy thereof, and may have a multilayer structure formed of a conductive layer (not shown) such as a refractory metal and the like and a low-resistive material conductive layer (not shown). An example of the multilayered structure may include a double layer of a chromium or molybdenum (alloy) lower layer and an aluminum (alloy) upper layer, or a triple layer of a molybdenum (alloy) lower layer, an aluminum (alloy) middle layer, and a molybdenum (alloy) upper layer. However, the data conductors 171, 172, 175a, and 175b may be made of various metals and conductors other than the above-stated metals and conductors.

Like the gate conductors 121 and 121b, the data conductors 171, 172, 175a, and 175b also have side surfaces that are inclined preferably at about 30° to 80° with respect to the substrate 110.

A passivation layer 180 is formed on the data conductors 171, 172, 175a, and 175b (FIG. 5). The passivation layer 180 is made of an inorganic material, an organic material, a low dielectric constant insulating material, and the like.

A plurality of contact holes 185 exposing the second output electrode 175b are formed in the passivation layer 180. A plurality of contact holes (not shown) exposing an end portion of the data line 171 may be formed in the passivation layer 180, and a plurality of contact holes (not shown) exposing an end portion of the gate line 121 may be formed in the passivation layer 180 and the interlayer insulating layer 160.

A plurality of pixel electrodes 190 are formed on the passivation layer 180. Each pixel electrode 190 is physically and electrically connected with the second output electrode 175b through the contact hole 185, and may be made of a transparent conductive material such as ITO or IZO or a reflective metal such as aluminum, silver, or an alloy thereof.

A plurality of contact assistants (not shown) or a plurality of connecting members (not shown) may be formed on the passivation layer 180, and they are connected with the gate line 121 and an exposed end portion of the data line 171.

A partition 361 is formed on the passivation layer 180 (FIG. 5). The partition 361 defines openings by surrounding a periphery of an edge of the pixel electrode 190 like a bank, and is made of an organic insulator or an inorganic insulator. The partition 361 may be made of a photoresist including a black pigment, and in this case, the partition 361 functions as a light blocking member and can be formed through a simple process.

An organic emission layer 370 is formed on the pixel electrode 190 and a common electrode 270 is formed on the organic emission layer 370. In this way, an organic light emitting element including the pixel electrode 190, the organic emission layer 370, and the common electrode 270 is formed.

In this case, the pixel electrode 190 is an anode which is a hole injection electrode, and the common electrode 270 becomes a cathode which is an electron injection electrode. However, the exemplary embodiment of the present invention is not limited thereto, and according to a driving method of the organic light emitting device, the pixel electrode 190 may be a cathode and the common electrode 270 may be an anode. The hole and electron are injected into the organic emission layer 370 from the pixel electrode 190 and the common electrode 270, respectively, and an exciton generated by coupling the injected hole and electron falls from an excited state to a ground state to emit light.

The common electrode 270 is formed on the organic emission layer 370. The common electrode 270 receives a common voltage, and is made of a reflective metal including calcium (Ca), barium (Ba), magnesium (Mg), aluminum (Al), silver (Ag), and the like, or a transparent conductive material such as ITO or IZO.

In such an organic light emitting device, the first semiconductor island 151a, the first control electrode 124a connected to the gate line 121, and the first input electrode 173a and the first output electrode 175a connected to the data line 171 form a switching thin film transistor Qs, and a channel of the switching thin film transistor Qs is formed in channel regions 154a1 and 154a2 of the first semiconductor island 151a. The second semiconductor island 151b, the second control electrode 124b connected to the first output electrode 175a, the second input electrode 173b connected to the driving voltage line 172, and the second output electrode 175b connected to the pixel electrode 190 form a driving thin film transistor Qd, and a channel of the driving thin film transistor Qd is formed in the channel region 154b of the second semiconductor island 151b. The pixel electrode 190, the organic light emitting member 370, and the common electrode 270 form an organic light emitting diode, and the pixel electrode 190 may become an anode and the common electrode 270 may become a cathode, or the pixel electrode 190 may become a cathode and the common electrode 270 may become an anode. The storage electrode 127, the driving voltage line 172, and the storage region 157 that overlap each other form a storage capacitor Cst.

The switching thin film transistor Qs transmits a data signal of the data line 171 in response to a gate signal of the gate line 121. When receiving the data signal, the driving thin film transistor Qd flows a current that depends on a voltage difference between the second control electrode 124b and the second input electrode 173b. The voltage difference between the second control electrode 124b and the second input electrode 173b is charged to the storage capacitor Cst and then maintained even after the switching thin film transistor Qs is turned off. The organic light emitting diode displays an image by emitting light of which the strength varies depending on a current of the driving thin film transistor Qd.

Referring back to FIG. 1, a sealant 300 is formed on the thin film transistor layer 150 in the exemplary embodiment. Thus, a dead space that needs to be formed next to the thin film transistor layer 150 for formation of the sealant 300 is not needed, and accordingly a bezel of the organic light emitting display device can be minimized.

Referring to FIG. 1, the sealant 300 according to the exemplary embodiment includes an organic sealant 310, an inorganic layer 320 formed outside of the organic sealant 310, and an elastic member 330 formed outside of the inorganic layer 320. The inorganic layer 320 and the elastic member 330 serve as protection members protecting the organic sealant.

As a UV curable sealant, the organic sealant is provided between the substrates, and the sealant is cured by irradiating UV rays to bond the sealant to the substrates.

Since a high-temperature laser is not user in curing of the sealant, the thin film transistor layer 150 located below the organic sealant 310 is not damaged, and accordingly an element formed in the thin film transistor layer 150 is not affected. In general, when a sealant is thermally cured, an element is damaged, and accordingly, the sealant should be formed to not be overlapped with a thin film transistor where the element is formed. In this case, an additional space for forming the sealant is required outside of the thin film transistor layer, and accordingly an undesired dead space is formed. However, in the organic light emitting display device according to the present exemplary embodiment, a UV curable organic sealant is used such that a sealant can be formed on the thin film transistor layer without damaging the element, and accordingly a dead space is not required and the size of a bezel can be minimized.

The organic sealant 310 according to the exemplary embodiment may include a UV curable polymer. In addition, the organic sealant 310 may include at least one of an acryl-based material, an epoxy-based material, a silicon-based material, and an allyl-based material.

However, the organic sealant 310 cannot sufficiently suppress permeation of moisture. Thus, when only the organic sealant 310 is used as a sealant, moisture permeates into the element, thereby causing deterioration of performance of the element and shortening life span of the element.

Thus, referring to FIG. 1, in the organic light emitting display device according to the present exemplary embodiment, the inorganic layer 320 formed outside of the organic sealant 310 has a sufficient waterproofing characteristic. The inorganic layer 320 is an inorganic layer having a high waterproofing characteristic like AlOx and TiOx, and, as shown in FIG. 1, the inorganic layer 320 is thin. In this case, the inorganic layer 320 may be formed using atomic layer deposition (ALD), but this is not restrictive.

Thus, the element can be double-protected by the organic sealant 310 and the inorganic layer 320 so that moisture permeation into the element can be sufficiently suppressed.

However, as shown in FIG. 1, the inorganic layer 320 is provided not only in a side surface of the organic sealant 310 but also in the substrates 100 and 200, and therefore an undercut of the inorganic layer 320 is formed in an interface between the organic sealant 310 and the substrates 100 and 200. When an external impact is applied to the organic display device, stress is concentrated to the interface and thus the inorganic layer 320 may be broken because the inorganic layer 310 is brittle, unlike the organic sealant 310.

When cracks are formed in the inorganic layer 320, moisture can easily penetrate into the element through the cracks.

Thus, in the organic light emitting display device of the present exemplary embodiment, the elastic member 330 made of a high-elastic material is formed outside of the inorganic layer 320. Here, any material having high elasticity is applicable as a material of the elastic member 330. In the exemplary embodiment, the elastic member 330 may be a polymer material such as an epoxy and the like. The elastic member 330 can be formed at the outermost side of the sealant by using any method known in the art.

Such an elastic member 330 absorbs an external impact applied to the organic light emitting device to thereby suppress generation of cracks in the inorganic layer 320. In addition, a moisture permeation path is extended by the elastic member 330 so that moisture permeation into the element can be further suppressed.

Figure 2:
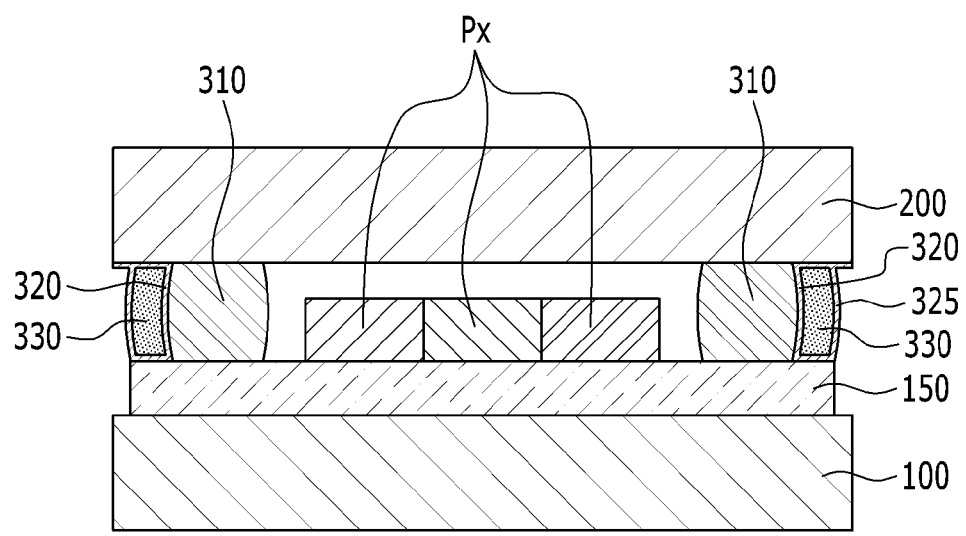
FIG. 2 is a cross-sectional view of an organic light emitting display device according to another exemplary embodiment.

FIG. 2 is a cross-sectional view of an organic light emitting display device according to another exemplary embodiment of the present invention. Referring to FIG. 2, an organic light emitting display device according to the present exemplary embodiment is mostly the same as the organic light emitting display device according to the exemplary embodiment of FIG. 1. Therefore, a description of the similar constituent elements will be omitted.

In the organic light emitting display device of FIG. 2, an inorganic layer 325 is additionally formed outside of an elastic member 330.

The elastic member 330 is generally made of a high-elastic organic material, and as the organic material does not have a sufficient waterproofing characteristic, there is a possibility of moisture permeation when the elastic member 330 is exposed to the outside.

However, in the organic light emitting display of FIG. 2, the inorganic layer 325 is additionally formed outside of the elastic member 330 and thus the above-stated problem can be solved. In addition, the element is protected with a four-element structure of the organic sealant 310, the inorganic layer 320, the elastic member 330, and the inorganic layer 325, and therefore moisture permeation can be more easily prevented.

In addition, such a sealant 300 is formed above all thin film transistor layers and thus an additional dead space for forming the sealant 300 is not required, and at the same time, the size of a bezel can be minimized.

As described, in the organic light emitting display device according to the exemplary embodiment, the sealant is formed with a three-element structure of the organic sealant, the inorganic layer formed outside of the organic sealant, and the elastic member formed outside of the inorganic layer, or a four-element structure of the organic sealant, the inorganic layer formed outside of the organic sealant, the elastic member formed outside of the inorganic layer, and the elastic member formed outside of the inorganic layer. Thus, the sealant is formed above the thin film transistor layer so the size of the bezel can be minimized, and a sufficient waterproofing characteristic can be assured by a dual structure of the organic layer and the inorganic layer, while at the same time, the elastic protection member is formed outside of the inorganic layer so the generation of cracks in the inorganic layer can be prevented.

Next, an effect of the organic light emitting display device according to the exemplary embodiment of the present invention will be described in detail by comparing with a comparative example.

Figure 6:
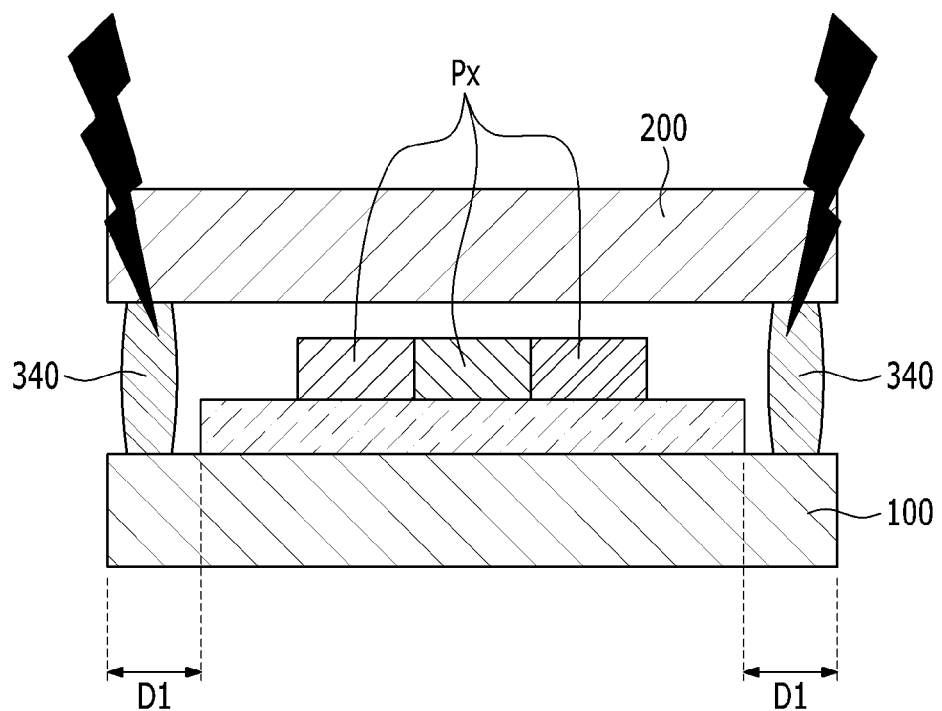
FIG. 6 to FIG. 8 are cross-sectional views of an organic light emitting display device according to a comparative example.
Figure 7:
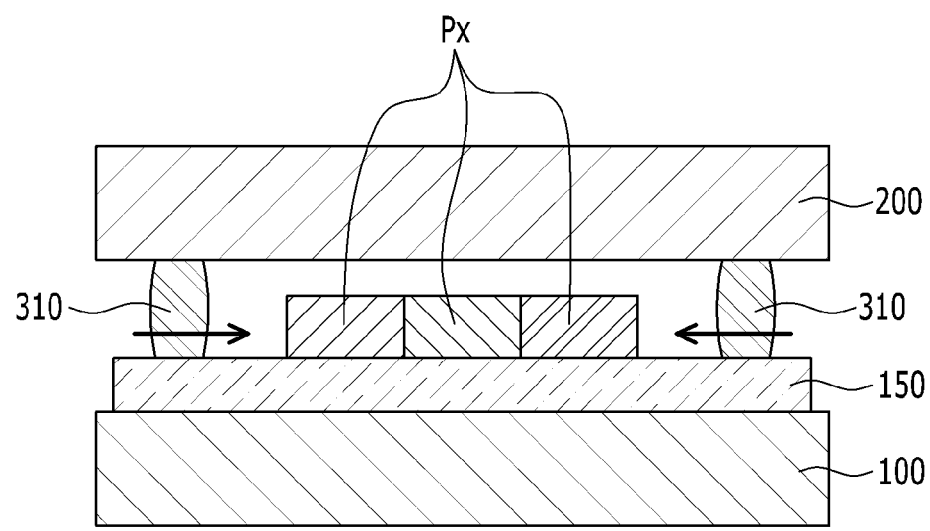
Figure 8:
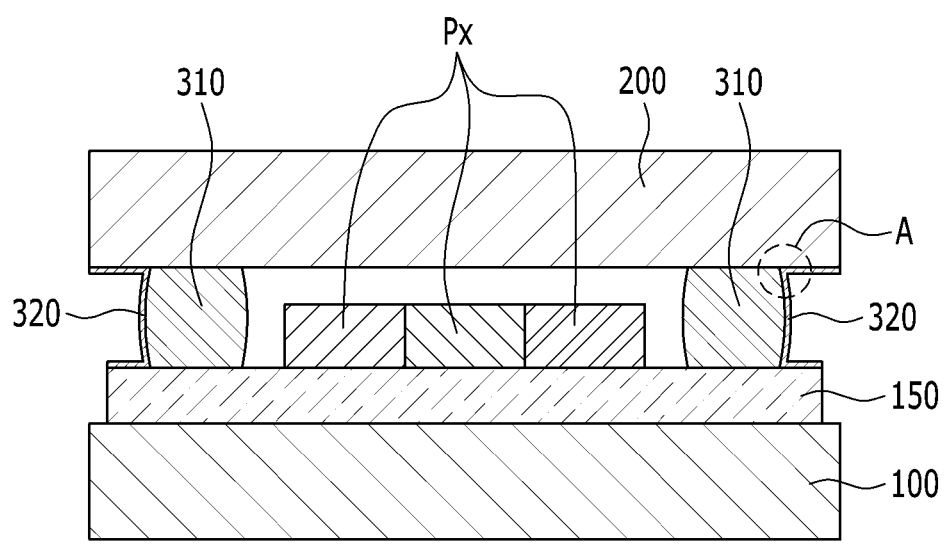

FIG. 6 to FIG. 8 are cross-sectional views of an organic light emitting display device according to a comparative example.

FIG. 6 illustrates an organic light emitting display device where a sealant made of a frit in general is formed. A frit 340 has an excellent characteristic of preventing moisture permeation into an element, but a sealant such as the frit 340 is cured by a high-temperature laser (marked by the arrow in the drawing). Heat applied during the curing process may affect the element, and thus, as shown in FIG. 6, the frit 340 is formed to not be overlapped with a thin film transistor layer 150. Thus, a dead space of D1 is additionally required, and this causes difficulty in minimization of the device and minimization of the bezel.

However, in the organic light emitting display device according to the exemplary embodiment of the present invention, as shown in FIG. 1 and FIG. 2, the sealant 300 is provided above the thin film transistor 150, and therefore the dead space and the bezel can be minimized.

FIG. 7 illustrates an organic light emitting display device in which a sealant is formed of an organic sealant. In case of FIG. 7, a UV curable organic sealant may be formed on the thin film transistor layer 150 to reduce a dead space, but an organic material has an insufficient waterproofing characteristic and thus moisture may permeate into the element. That is, as shown by the arrow in FIG. 7, external moisture permeates into the element through the organic material and thus the life span of the element is shortened.

However, in the organic light emitting display device according to the exemplary embodiment of the present invention shown in FIG. 1 and FIG. 2, the inorganic layer 320 having the excellent waterproofing characteristic is formed outside of the organic sealant 310 and thus the insufficient waterproofing characteristic of the organic material can be supplemented. That is, the element is dually protected by the organic sealant 310 and the inorganic layer 320 so that permeation of external moisture into the element can be prevented.

FIG. 8 shows an organic light emitting display device in which a sealant is formed of an organic sealant and an inorganic layer. In the organic light emitting display of FIG. 8, the sealant is formed of a dual structure of the organic sealant 310 and the inorganic layer 320, and thus the insufficient waterproofing characteristic of the organic material can be supplemented. However, when the inorganic layer 320 is formed at the outside of the organic sealant 310, cracks may be generated in the inorganic layer 320 when an impact is applied to the element.

Figure 9:
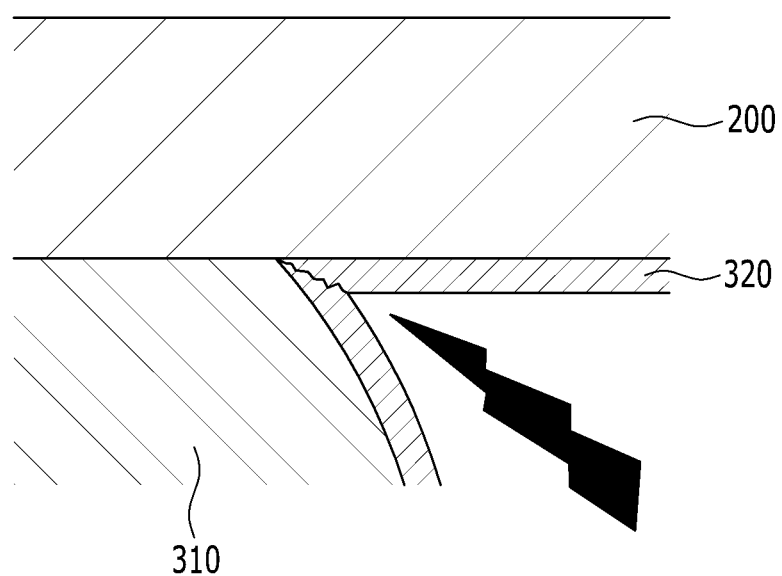
FIG. 9 is an enlarged view of the part "A" in FIG. 8.

FIG. 9 is an enlarged view of the area "A" in FIG. 8. Referring to FIG. 9, the organic sealant 310 has a curved surface contacting a substrate 200. When the organic sealant 310 is formed, an organic material having fluidity is cured by irradiation of UV rays, and thus a side surface of the organic sealant 310 is slightly curved rather than being straightly formed.

Thus, as shown in FIG. 9, the inorganic layer 320 is bent with a narrow angle at a surface where the substrate 200 and the organic sealant 310 contact each other. When an external impact is applied, stress is concentrated to a portion where the inorganic layer 320 is abruptly bent. Thus, when the external impact is applied to the organic light emitting display device, cracks are generated in the bent portion of the inorganic layer 320 as shown in FIG. 9.

Such a crack becomes a path for permeation of moisture, and thus moisture permeates into the element through the path, thereby causing deterioration of performance of the element.

However, in the organic light emitting display device according to the exemplary embodiment, as shown in FIG. 1 and FIG. 2, the elastic member 330 is formed outside of the inorganic layer 320 to absorb impact transmitted to the inorganic layer 320. Thus, although the impact is applied to the organic light emitting display device, the impact is not transmitted to the inorganic layer 320, thereby prevention generation of cracks in the inorganic layer 320. Accordingly, moisture permeation through cracks can be prevented, and the element can be more effectively protected.

Figure 10:
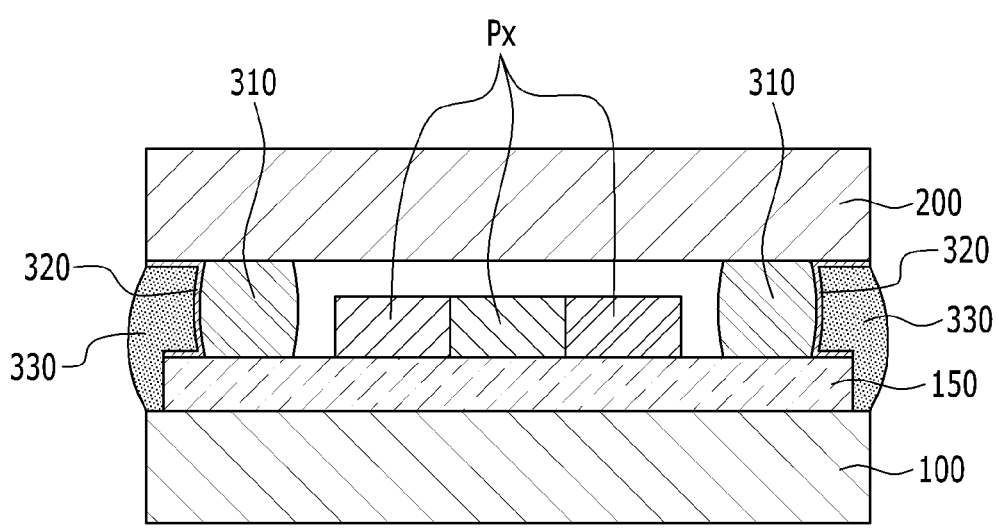
FIG. 10 and FIG. 11 illustrate an organic light emitting display device according to another exemplary embodiment of the present invention.
Figure 11:
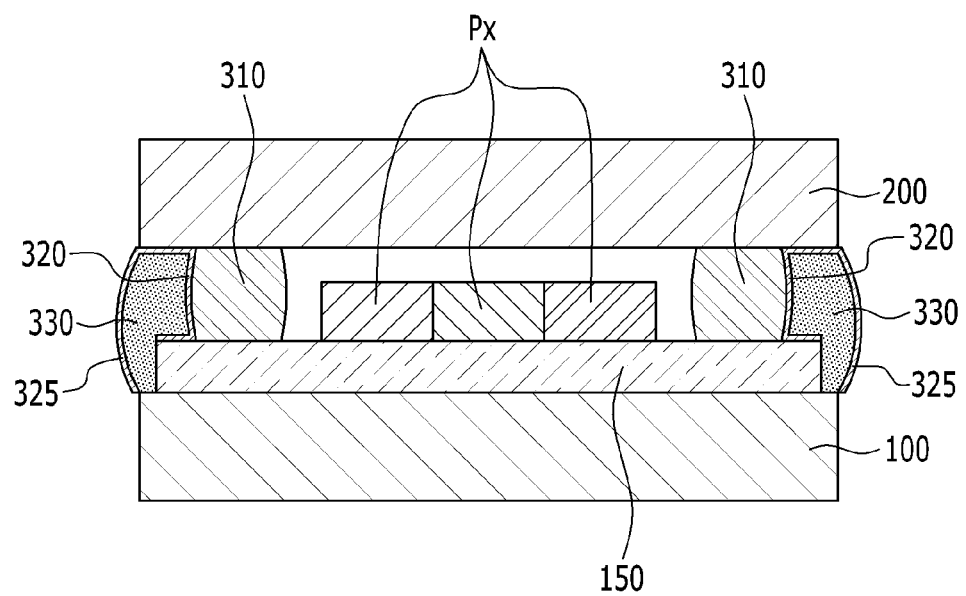

FIG. 10 and FIG. 11 illustrate organic light emitting display devices according to other exemplary embodiments. An organic light emitting display device shown in FIG. 10 is almost the same as the organic light emitting display device of the exemplary embodiment of FIG. 1. However, an elastic member 330 formed in the organic light emitting display device of the exemplary embodiment of FIG. 10 is wider than that of the organic light emitting display device of the exemplary embodiment of FIG. 1. That is, the elastic member 330 of the organic light emitting display device according to the exemplary embodiment of FIG. 1 does not wholly fill a space between the first substrate 100 and the second substrate 200, but in the organic light emitting display device of the exemplary embodiment of FIG. 10, the elastic member 330 wholly fills a space between a first substrate 100 and a second substrate 200. As shown in FIG. 10, the elastic member 330 may be partially protruded to the outside from the first and second substrates 100 and 200.

Alternatively, an inorganic layer may be additionally formed outside of the elastic member 330. FIG. 11 illustrates an organic light emitting display device according to another exemplary embodiment of the present invention. Referring to FIG. 11, an elastic member 330 is formed to wholly fill a space between a first substrate 100 and a second substrate 200, and an inorganic layer 325 is formed outside of the elastic member 300.

Figure 12:
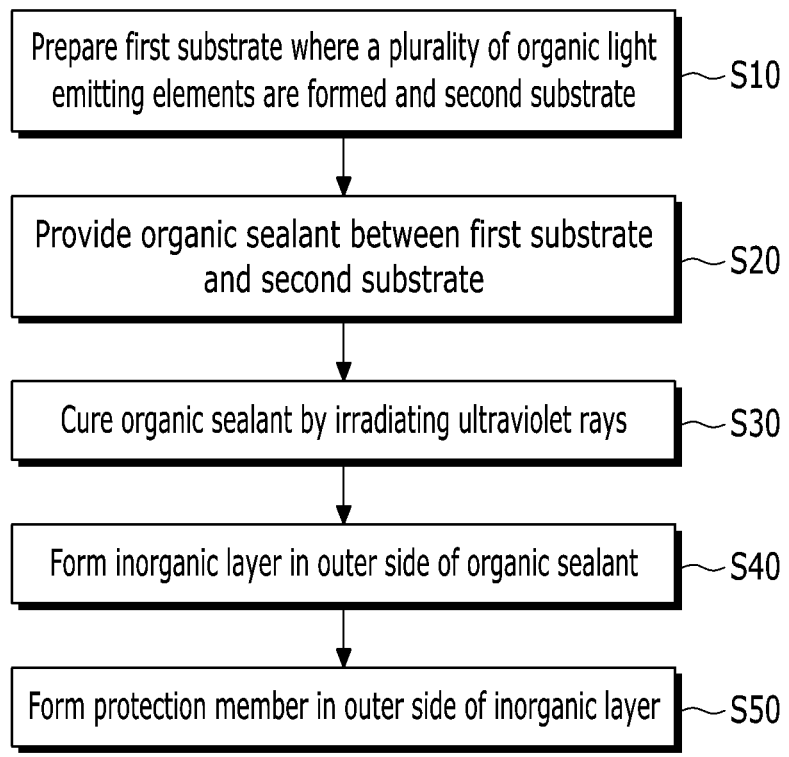
FIG. 12 is a process flowchart of a manufacturing method of an organic light emitting display device according to an exemplary embodiment.

Next, a method for manufacturing an organic light emitting display device according to an exemplary embodiment will be described with reference to FIG. 12. FIG. 12 is a process flowchart of a manufacturing method of an organic light emitting display device according to an exemplary embodiment.

The manufacturing method of the organic light emitting display device according to the exemplary embodiment includes: preparing a first substrate where a plurality of organic light emitting elements are formed and a second substrate (S10); providing an organic sealant between the first substrate and the second substrate (S20); curing the organic sealant by irradiating UV rays (S30); forming an inorganic layer outside of the organic sealant (S40); and forming an elastic member outside of the inorganic layer (S50).

In the step S10, the first substrate where the plurality of organic light emitting elements are formed and the second substrate that covers the first substrate are prepared. The plurality of organic light emitting elements formed in the first substrate function as a plurality of pixels, and each pixel may have a structure shown in FIG. 3 to FIG. 5, but this is not restrictive.

In step S20, the organic sealant is provided between the first substrate and the second substrate. In this case, the organic sealant is a UV curable organic sealant as previously described. That is, the organic sealant may include a UV curable polymer. In addition, the organic sealant 310 may include at least one of an acryl-based material, an acryl-based material, an epoxy-based material, a silicon-based material, and an allyl-based sealant. In this case, the organic sealant is provided above a thin film transistor layer formed in the step S10. That is, the organic sealant is not formed above the first substrate but is formed on the thin film transistor layer where the plurality of elements are formed.

In step S30, the organic sealant is cured by irradiating UV rays to the organic sealant. Since the UV curable organic sealant is applied, the organic sealant is cured by UV ray irradiation and thus is bonded with the first substrate and the second substrate. The elements are not damaged in the curing process because the organic sealant is cured only by UV rays without irradiation of a laser or high-temperature heat.

In step S40, the inorganic layer is formed outside of the organic sealant. The organic layer is made of a material having an excellent waterproofing characteristic such as $AlO_x$ and $TiO_x$. Such an inorganic layer may be formed through atomic laser deposition (ALD).

In the fifth step (S50), the elastic member is formed outside of the inorganic layer. Any high-elastic material is applicable as the elastic member, and as an example, an epoxy may be included. The elastic member may be a typical polymer material.

Through the above-stated manufacturing method, an organic light emitting display device such as the organic light emitting display device of the exemplary embodiment of FIG. 1 is manufactured.

Figure 13:
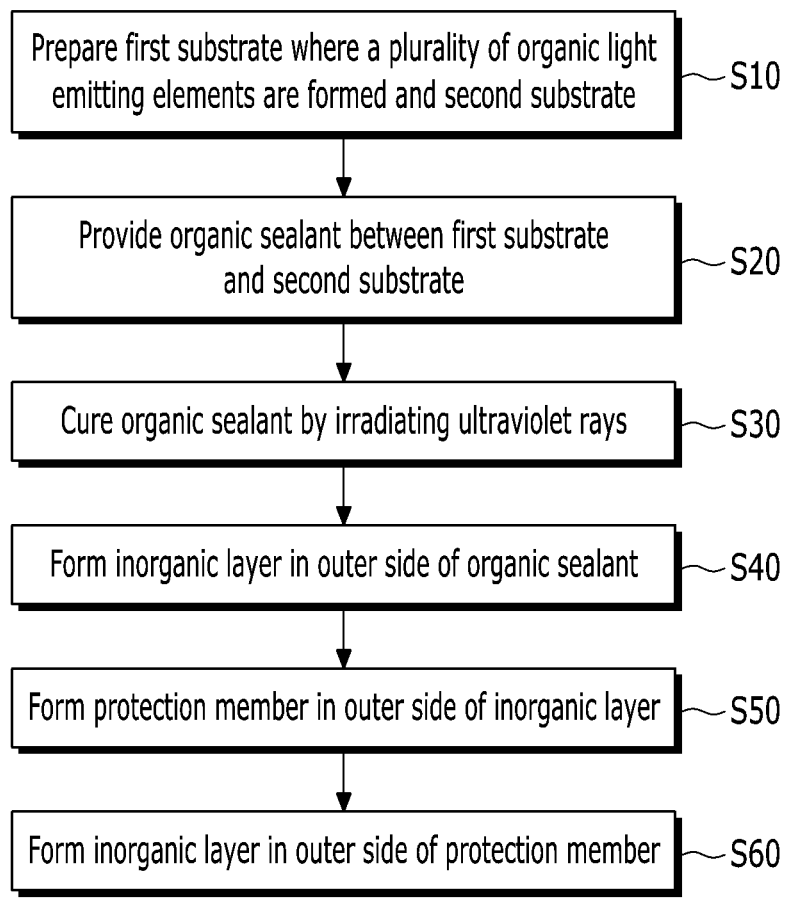
FIG. 13 is a process flowchart of an organic light emitting display device according to an exemplary embodiment.

Next, a manufacturing method of an organic light emitting display device according to another exemplary embodiment will be described with reference to FIG. 13. FIG. 13 is a process flowchart of an organic light emitting display device according to another exemplary embodiment. The manufacturing method of the organic light emitting display device of FIG. 13 is similar to the manufacturing method of the organic light emitting display device of the exemplary embodiment of FIG. 12. The similar constituent elements will not be further described.

The manufacturing method of the organic light emitting display device of the exemplary embodiment of FIG. 13 additionally includes forming an inorganic layer outside of the elastic member after forming the protection member outside of the inorganic layer. In this case, the inorganic layer may be made of a material having an excellent waterproofing characteristic such as $AlO_x$ and $TiO_x$, and such an inorganic layer may be formed through atomic laser deposition (ALD).

Through the above-stated manufacturing method, an organic light emitting display device like the organic light emitting display device of the exemplary embodiment shown in FIG. 2 is manufactured.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. An organic light emitting display device comprising:
    a first substrate provided with a thin film transistor layer where a plurality of pixels are disposed;
    a second substrate overlapping the first substrate; and
    a sealant disposed between the first substrate and the second substrate, not overlapping the pixel,
    wherein
    the sealant comprises an organic sealant and a protection member contacting the organic sealant, and
    the protection member includes an inorganic member and an elastic member.

2. The organic light emitting display device of claim 1, wherein the organic sealant comprises a material being cured by ultraviolet rays.

3. The organic light emitting display device of claim 1, wherein the organic sealant comprises an epoxy-based material.

4. The organic light emitting display device of claim 1, wherein the inorganic member comprises $AlO_2$ or $TiO_2$.

5. The organic light emitting display device of claim 1, wherein the elastic member is a polymer material.

6. The organic light emitting display device of claim 1, wherein the elastic member is an epoxy-based resin.

7. The organic light emitting display device of claim 1, wherein the protection member additionally includes an inorganic member contacting the elastic member.

8. The organic light emitting display device of claim 1, wherein the elastic member fills a space between the first substrate and the second substrate along the edge of substrate assembly, not overlapped the pixel area.

9. The organic light emitting display device of claim 8, comprising an inorganic member contacting the elastic member.

10. The organic light emitting display device of claim 1, wherein a touch sensor is disposed in the second substrate.

11. An organic light emitting display device comprising:
    a first substrate provided with a thin film transistor layer where a plurality of pixels are disposed;
    a second substrate overlapping the first substrate; and
    a sealant disposed between the first substrate and the second substrate,
    wherein
    the sealant comprises an organic sealant and a protection member contacting the organic sealant, and
    the protection member includes an inorganic member and an elastic member.

12. A method for manufacturing an organic light emitting display device, comprising:
    preparing a first substrate where a plurality of organic light emitting elements are formed and a second substrate;
    providing an organic sealant along the edge of pixel area, not overlapped the pixel, between the first substrate and second substrate;
    curing the organic sealant by irradiating ultraviolet rays to the organic sealant;
    forming an inorganic member contacting the organic sealant; and
    forming an elastic member contacting the inorganic member.

13. The method for manufacturing the organic light emitting display device of claim 12, wherein the organic sealant comprises an epoxy-based material.

14. The method for manufacturing the organic light emitting display device of claim 12, wherein the inorganic member comprises $AlO_2$ or $TiO_2$.

15. The method for manufacturing the organic light emitting display device of claim 12, wherein the inorganic member is deposited through atomic layer deposition.

16. The method for manufacturing the organic light emitting display device of claim 12, wherein the elastic member is an epoxy-based resin.

17. The method for manufacturing the organic light emitting display device of claim 16, wherein the elastic member fills a space between the first substrate and the second substrate, along the edge of substrate assembly, not overlapped the pixel area.

18. The method for manufacturing the organic light emitting display device of claim 12, further comprising, after forming the elastic member contacting the inorganic member, forming an inorganic member contacting the elastic member.

19. The method for forming the organic light emitting display device of claim 18, wherein the elastic member wholly fills a space between the first substrate and the second substrate.

* * * * *